(12) United States Patent
Choke et al.

(10) Patent No.: US 10,374,848 B2
(45) Date of Patent: Aug. 6, 2019

(54) AMPLITUDE DEMODULATORS AND RELATED METHODS

(71) Applicant: MEDIATEK Singapore Pte. Ltd., Singapore (SG)

(72) Inventors: Tieng Ying Choke, Singapore (SG); Hon Cheong Hor, Singapore (SG)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/820,211

(22) Filed: Nov. 21, 2017

(65) Prior Publication Data

US 2018/0198652 A1 Jul. 12, 2018

Related U.S. Application Data

(60) Provisional application No. 62/444,874, filed on Jan. 11, 2017.

(51) Int. Cl.
*H04L 27/06* (2006.01)
*H03K 9/02* (2006.01)
*H04L 27/00* (2006.01)

(52) U.S. Cl.
CPC .............. *H04L 27/06* (2013.01); *H03K 9/02* (2013.01); *H04L 2027/0026* (2013.01); *H04L 2027/0055* (2013.01)

(58) Field of Classification Search
CPC ......... H04L 27/06; H03K 9/02; H04B 14/004
USPC .......................... 375/320; 329/347, 349, 353
See application file for complete search history.

(56) References Cited

U.S. PATENT DOCUMENTS

| | | | |
|---|---|---|---|
| 6,907,088 B1 * | 6/2005 | Nakane | G06K 19/0723 329/347 |
| 7,847,627 B2 * | 12/2010 | Kranabenter | H04L 27/06 329/347 |
| 7,885,359 B2 | 2/2011 | Meltzer | |
| 7,890,080 B2 | 2/2011 | Wu et al. | |

(Continued)

FOREIGN PATENT DOCUMENTS

| CN | 105049069 A | 11/2015 |
|---|---|---|
| TW | 2014-24307 A | 6/2014 |

(Continued)

OTHER PUBLICATIONS

Extended Search Report dated Jun. 7, 2018 in connection with European Application No. 18150474.7.

(Continued)

*Primary Examiner* — Betsy Deppe
(74) *Attorney, Agent, or Firm* — Wolf, Greenfield & Sacks, P.C.

(57) ABSTRACT

A circuit for demodulating an input signal is described. The circuit may be configured to demodulate signals modulated with amplitude-based modulation schemes, such as amplitude shift keying (ASK), such that information is encoded in the amplitude of the signals. The circuit may comprise an amplitude detector for extracting the envelope of a received amplitude-modulated signal, a phase/frequency detector for detecting phase and/or frequency shifts, and a selector configured to select one between the output of the amplitude detector and the output of the phase/frequency detector. The selector may be controlled by a control circuit including a delay unit.

20 Claims, 6 Drawing Sheets

(56) References Cited

U.S. PATENT DOCUMENTS

| | | |
|---|---|---|
| 7,907,005 B2 | 3/2011 | Kranabenter |
| 8,838,023 B2 | 9/2014 | Charrat et al. |
| 8,934,836 B2 | 1/2015 | Lefley |
| 2008/0252367 A1* | 10/2008 | Pettersen ............... H04L 27/06 329/311 |
| 2011/0064165 A1 | 3/2011 | Bae et al. |
| 2013/0321230 A1 | 12/2013 | Merlin et al. |
| 2016/0142113 A1 | 5/2016 | Gaethke et al. |
| 2016/0241384 A1 | 8/2016 | Frantzeskakis et al. |
| 2018/0006801 A1 | 1/2018 | Hung et al. |
| 2018/0110018 A1 | 4/2018 | Yu et al. |
| 2018/0183637 A1* | 6/2018 | Undheim ............... H04L 27/06 |
| 2018/0198489 A1 | 7/2018 | Leow et al. |
| 2018/0198653 A1 | 7/2018 | Cao et al. |

FOREIGN PATENT DOCUMENTS

| | | |
|---|---|---|
| TW | 2015-34016 A | 9/2015 |
| WO | WO 2008/093254 A1 | 8/2008 |

OTHER PUBLICATIONS

Choke et al., "A 3.4Mbps NFC Card Emulator Supporting 40mm2 Loop Antenna" 2017 IEEE Radio Frequency Integrated Circuits Symposium (RFIC), Jun. 4, 2017, pp. 244-247.

Lien et al., A Self-Calibrating NFC SoC with a Triple-Mode Reconfigurable PLL and a Single-Path PICC-PCD Reciever in 0.1 μm CMOS. IEEE International Solid-State Circuits Conference Feb. 11, 2014, Session 9, Digest of Technical Papers. 158-59.

Bo et al., Low power clock recovery circuit for passive HF RFID tag. Analog Integr Circ Sig Process. 2009;59:207-14.

Lichong et al., High-precision high-sensitivity clock recovery circuit for a mobile payment application. J of Semiconductors. May 2011;32(5):055007-1-6.

U.S. Appl. No. 15/726,993, filed Oct. 6, 2017, Cao et al.
U.S. Appl. No. 15/867,650, filed Jan. 10, 2018, Leow et al.

\* cited by examiner

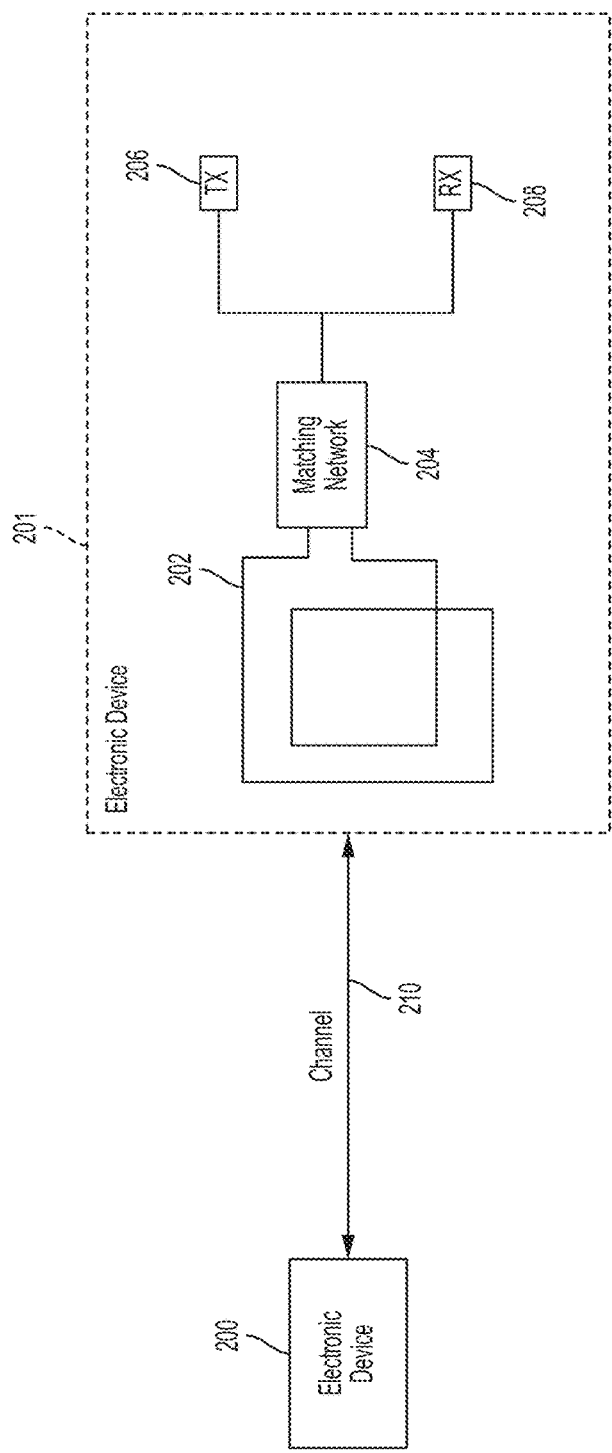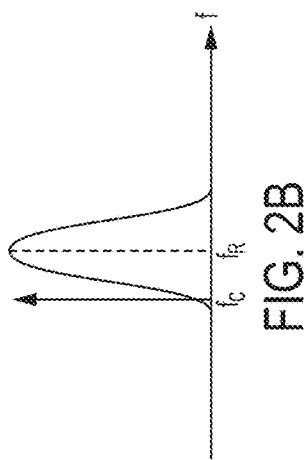
FIG. 2A
FIG. 2B

AMPLITUDE DEMODULATORS AND RELATED METHODS

RELATED APPLICATIONS

This Application claims priority under 35 U.S.C. § 119(e) to U.S. Provisional Application Ser. No. 62/444,874, entitled "3.4MBPS NFC CARD EMULATOR SUPPORTING 40MM2 LOOP ANTENNA" filed on Jan. 11, 2017, which is herein incorporated by reference in its entirety.

BACKGROUND

Amplitude modulation schemes are often used in wireless communications to transmit signals between a transmitter and a receiver. An amplitude modulated signal can be generated by mixing a baseband signal with a carrier.

SUMMARY

Some embodiments relate to a method for demodulating an amplitude-modulated input signal received with an antenna. The method may comprise receiving a detection signal generated with a matching network coupled to the antenna, based on the amplitude-modulated input signal, and generating a demodulated output signal, wherein generating the demodulated output signal comprises detecting whether ringing in the detection signal occurs in a first time period, and when ringing in the detection signal is detected to occur in the first time period, setting the demodulated output signal to a first level during at least a portion of the first time period.

Some embodiments relate to a demodulator for demodulating an amplitude-modulated input signal received with an antenna, the demodulator comprising control circuitry configured to receive a detection signal generated with a matching network coupled to the antenna based on the amplitude-modulated input signal, and generate a demodulated output signal, wherein the circuitry is configured to generate the demodulated output signal at least in part by detecting whether ringing in the detection signal occurs in a first time period, and when ringing in the detection signal is detected to occur in the first time period, setting the demodulated output signal to a first level during at least a portion of the first time.

Some embodiments relate to a demodulator for demodulating an amplitude-modulated input signal received with an antenna, the demodulator comprising an amplitude detector coupled to a matching network coupled to the antenna, a phase detector or a frequency detector coupled to the matching network, and a selector having a first input terminal coupled to the amplitude detector, a second input terminal coupled to the phase detector or the frequency detector, and a control terminal coupled to control circuitry.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 2A is a block diagram illustrating a communication system, according to some non-limiting embodiments.

FIG. 2B is a plot illustrating a resonant frequency and a carrier frequency, according to some non-limiting embodiments.

DETAILED DESCRIPTION

The inventors have developed circuits for amplitude envelope demodulation (e.g., amplitude shift keying envelope demodulation) which is immune to amplitude envelope distortion due to undesired amplitude ringing when the carrier is off. In some circumstances, ringing may arise when a natural oscillation occurs in a receiving circuit. The frequency at which such an oscillation is established may depend on the electrical characteristic of the receiving circuit, such the impedance of the impedance matching network.

Figure 1:
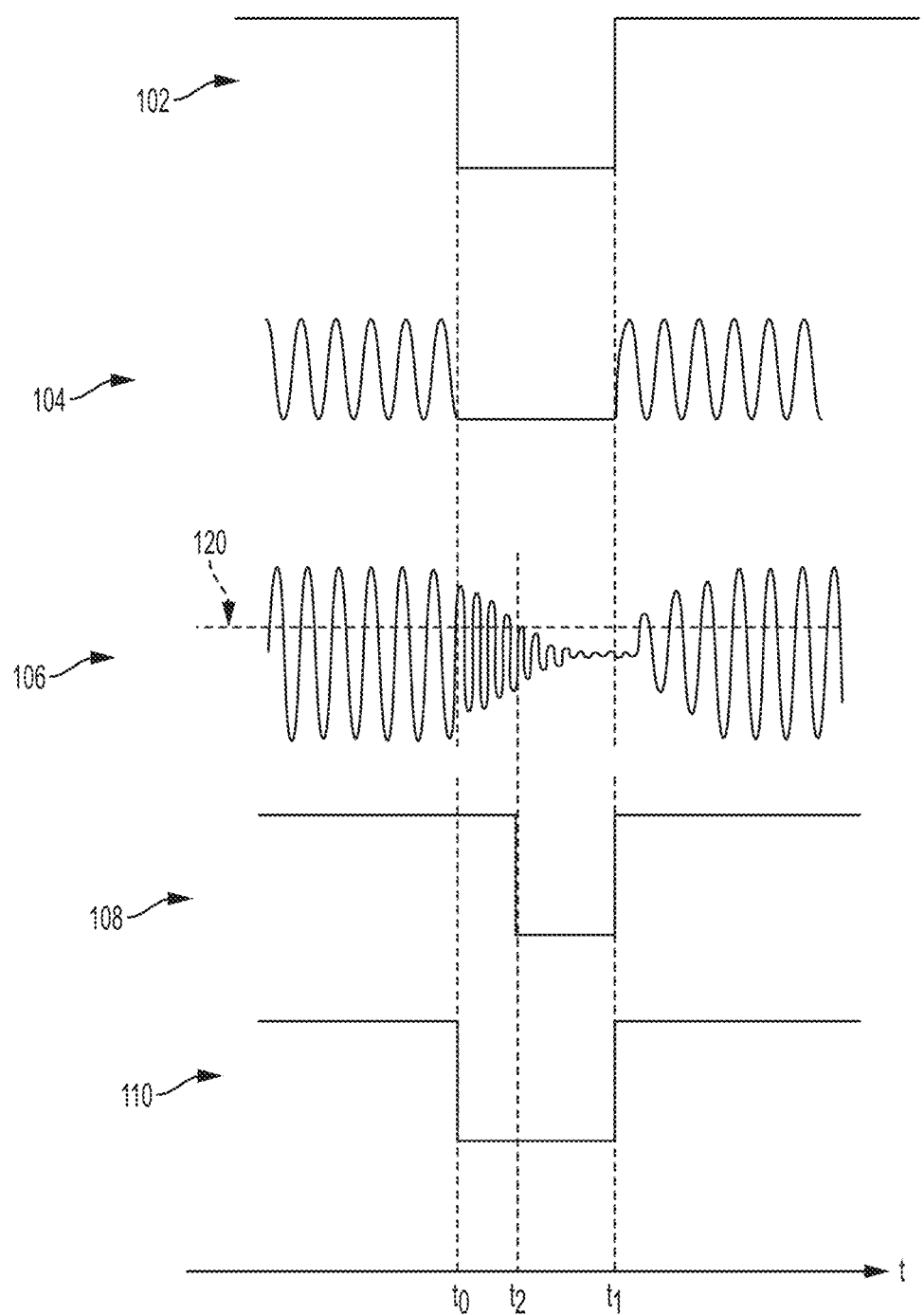
FIG. 1 is a plot illustrating a plurality of baseband signals and a plurality of amplitude-modulated signals, according to some non-limiting embodiments.

The inventors have recognized and appreciated that ringing in circuits for receiving amplitude-modulated signals may cause errors in the detection of the sequence of symbols being transmitted. Such errors may arise due to the quality factor (Q) of the matching network, which is typically set to a high value to maximize the amount of power transferred from the transmitter (TX) antenna to the receiving (RX) antenna. In these circumstances the circuit continues to oscillate even when the transmitting carrier is off (e.g., encoded as a low level). In some circumstances, this ringing can be erroneously interpreted by the demodulator as a high-level (which may represent a logic 1 in some embodiments), thus resulting in a bit error. This situation is depicted in the example of FIG. 1, which illustrates baseband signals 102, 108 and 110, and amplitude-modulated signals 104 and 106.

Baseband signal 102 incorporates the message to be sent from a transmitter to a receiver prior to the modulation. In this case, the message includes a logic 1, a logic 0 and a logic 1. The first logic 1 extends in time before $t_0$, the logic 0 extends between $t_0$ and $t_1$, and the second logic 1 extends after $t_1$. Modulated signal 104 is obtained by modulating baseband signal 102 with a carrier frequency. In this example, a modulation depth of 100% is applied, and as a result modulated signal 104 is constant in correspondence to logic 0s while varying according to the carrier frequency in correspondence to logic 1s. Modulated signal 104 is then transmitted through a communication channel, such as between two antennas.

Modulated signal 106 is the signal obtained at the receiver. As illustrated, the received signal exhibits waveform distortion due to an oscillation between $t_0$ and $t_2$, that was not part of the transmitted signal 104. This oscillation may be due to amplitude ringing, which in some embodiments may include natural oscillations arising in the matching network coupled between the receiving antenna and the receiving circuit. The ringing oscillation may be damped after a period of time due to the fact that the antenna matching network circuit producing this oscillation has a finite quality-factor (Q). The receiving circuit sets an amplitude threshold 120 such that if modulated signal 106 has an envelope greater than threshold 120, a logic 1 is produced, and if modulated signal 106 has an envelope less than threshold 120, a logic 0 is produced. In the ideal case (i.e., without ringing), baseband signal 110 would be produced. However, due to the presence of ringing, baseband signal 108 is produced instead. Since the envelope of modulated signal 106 is above the threshold between $t_0$ and $t_2$, a logic 0 is erroneously produced in this time interval. Baseband signal 108 switches to a logic 1 only when the envelope of the natural oscillation falls below the threshold at $t_2$.

The inventors have recognized and appreciated that the effects of ringing may be mitigated by further detecting the phase and/or frequency changes in the received amplitude-modulated signal to detect that ringing is occurring during a time period and by correcting the demodulated signal accordingly. In particular, the inventors have recognized and appreciated that, if the frequency of these natural oscillations are offset relative to the carrier frequency of the received signal, the received amplitude-modulated signal may exhibit phase and/or frequency variations relative to the carrier signal. By detecting such phase and/or frequency variation, it may be inferred that ringing is underway and the transmitter power carrier is off (hence, a low-level may be expected).

Demodulators according to some embodiments are provided which include a matching network, an amplitude detector and a phase/frequency detector. The matching network may be configured to enhance coupling between a receive terminal (e.g., a receiving antenna) and may be characterized by a resonant spectral response. The matching network may be arranged such that the resonant frequency is slightly offset relative to the expected carrier frequency of received signal. The amplitude modulator is configured to demodulate the received signal by extracting its envelope, and the phase/frequency detector is configured to monitor phase and/or frequency shifts in the received signal. If the phase/frequency detector determines that a phase and/or frequency shift has occurred, the received signal is treated as a natural oscillation (e.g., the carrier signal is off) and is interpreted as a predetermined level (e.g., a low-level).

FIG. 2A illustrates a communication channel formed between a pair of electronic devices, according to some non-limiting embodiments. As shown, electronic devices 200 and 201 are in communication with each other via communication channel 210. In some embodiments, communication channel 210 is a wireless channel, such as a radio-frequency channel, though wired channels may be used in other embodiments. Different communication protocols may be used including but not limited to near-field communication (NFC), and radio-frequency identification (RFID). When used in connection with NFC, electronic devices 200 and 201 may communicate with each other in a channel defined by a carrier frequency $f_C$ that may be approximately 13.56 MHz (e.g., between 13.553 MHz and 13.567 MHz). Of course other frequency bands may be used, such as industrial, scientific and medical (ISM) radio bands. Examples of ISM bands that may be used in some embodiments include 6.765 MHz-6.795 MHz, 26.957 MHz-27.283 MHz, 40.66 MHz-40.7 MHz, and 902 MHz-928 MHz. Other carrier frequencies may be used in other embodiments. The modulation scheme used for communication channel 210 may be an amplitude modulation scheme. An example of an amplitude modulation scheme that may be used at least in some embodiments is amplitude shift keying (ASK). Of course, other types of amplitude modulation schemes may be used, such as multi-level amplitude modulation schemes.

In at least some of the embodiments in which communication channel 210 is wireless, electronic device 201 may include an antenna 202 (which is depicted as a coil in FIG. 2A, though any other suitable type of antenna may be used) for transmitting and/or receiving signals via electromagnetic induction. In some embodiments antenna 202 may be implemented by winding a conductive lead one or more times. Electronic device 201 may include a matching network 204 coupled to antenna 210 or other receive terminals. Matching network 204 may produce a detection signal based on the signal received by antenna 202. Matching network 204 may be configured to enhance power transfer between antenna 210 and the circuitry of electronic device 201. In some embodiments, matching network 204 may exhibit a pass-band frequency response. The bandwidth of the pass-band may depend on the Q of the matching network, such that the lower the Q, the larger the bandwidth. In some embodiments, the resonant frequency $f_R$ of the matching network may be set to be slightly offset relative to the frequency of the carrier $f_C$ (as illustrated in the example of FIG. 2B). In some embodiments, resonant frequency $f_R$ may be sufficiently different from carrier frequency $f_C$ to give rise to appreciable phase and/or frequency shifts when natural oscillations arise. Nonetheless, resonant frequency $f_R$ may be sufficiently close to carrier frequency $f_C$ so that the carrier frequency is within the pass-band of the matching network. In this way, signals oscillating at $f_C$ can still pass through the matching network. In this case, the Q of matching network 204 may be set to a sufficiently low value to quickly dampen the ringing oscillation.

Figure 3:
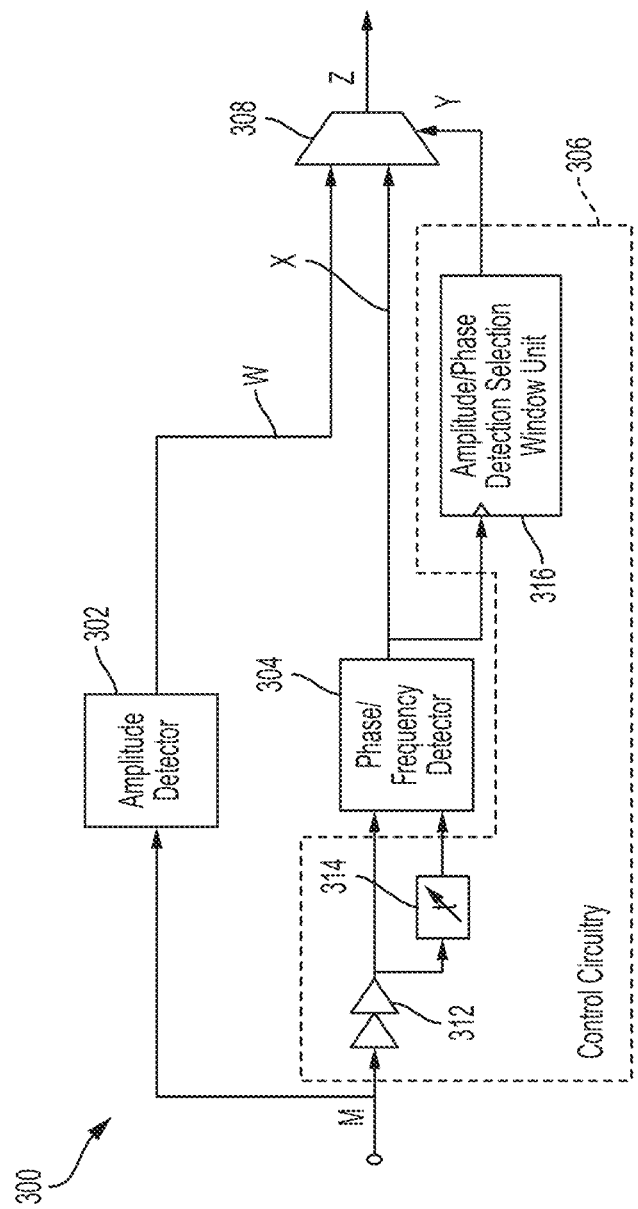
FIG. 3 is a block diagram illustrating a demodulator having an amplitude detector and a phase detector, according to some non-limiting embodiments.

Referring back to FIG. 2A, electronic device 201 includes transmitter (TX) 206 and receiver (RX) 208. TX 206 may include an amplitude modulator, amplifiers and other circuitry for transmitting signals via communication channel 210. Similarly, RX 208 may include an amplitude demodulator, amplifiers and other circuitry for receiving signals from communication channel 210. An example of a demodulator that may be used for RX 208 is illustrated in FIG. 3.

Figure 4A:
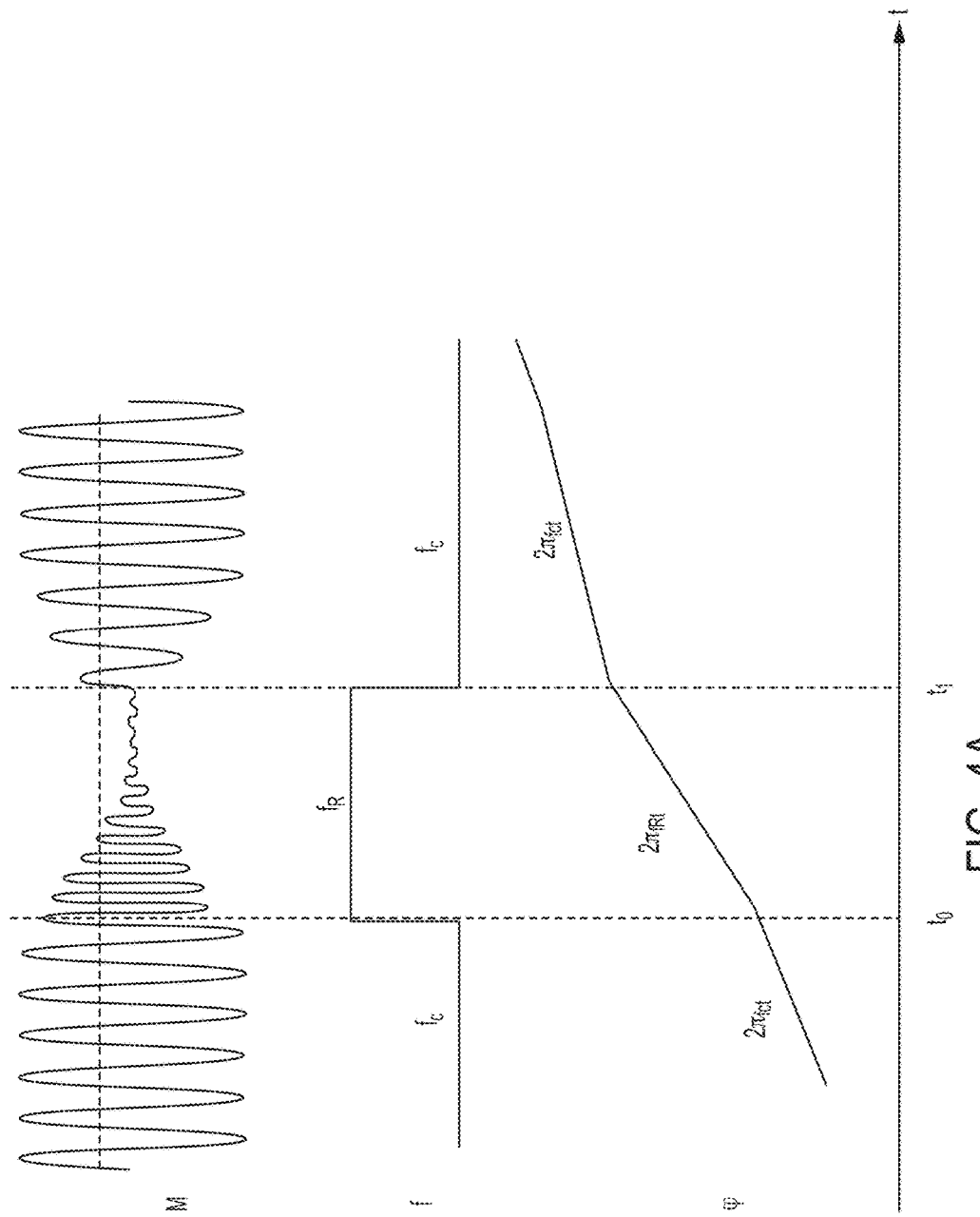
FIG. 4A is a plot illustrating how the frequency and phase of an amplitude-modulated signal vary over time, according to some non-limiting embodiments.

Demodulator 300 includes amplitude detector 302, phase/frequency detector 304, control circuitry 306, and selector 308. Selector 308 may be configured to select one between the output of amplitude detector 302 (referred to as "first intermediate signal W") and the output of phase/frequency detector 304 (referred to as "second intermediate signal X"), based on a control signal provided by control circuitry 306 (referred to as "control signal Y"). Amplitude detector 302 may include a circuit for extracting the envelope of a received amplitude-modulated signal and determining whether the extracted envelope is above or below a threshold. Phase/frequency detector 304 may include circuitry for monitoring the phase and/or the frequency of a received signal, and determining whether variations in phase and/or frequency have occurred. FIG. 4A illustrates how the frequency and phase of received signal M (also referred to as the detection signal) may vary when ringing occurs. In this example, received signal M exhibits ringing between $t_0$ and $t_1$. The frequency f of received signal M is equal to the carrier frequency $f_C$ before $t_0$ and after $t_1$ and is equal to resonant frequency $f_R$ between $t_0$ and $t_1$. As a result, the phase $\phi$ of received signal M varies as $2\pi f_C t$ before $t_0$ and after $t_1$ and as $2\pi t f_R t$ between $t_0$ and $t_1$.

Referring back to FIG. 3, control circuitry 306 may include squarer 312, which may be configured to square the received amplitude-modulated signal thereby obtaining a square wave. Squarer 312 may be implemented using a pair of inverters in some embodiments. In some embodiments, a time delay unit 314 is used to delay the squared signal. In one specific example time delay unit 314 may be implemented using a phase locked loop (PLL). It should be appreciated, however, that any suitable type of circuit configured to delay signals may be used, additionally or alternatively. Phase/frequency detector 304 may receive as a first input the squared wave and as a second input the delayed squared wave. Phase/frequency detector 304 may include circuitry for comparing the phases and/or the frequencies of the square wave and the delayed square wave and for determining whether the frequency has changed and/or whether the rate at which the phase varies has changed. In some embodiments, control circuitry 306 includes amplitude/phase detection selection window unit 316, which may output control signal Y. It should be appreciated that the demodulator of FIG. 3 is only an example of an implementation that may be used in connection with the demodulation techniques described herein. Alternative demodulator implementations may be used in other embodiments.

Figure 4B:
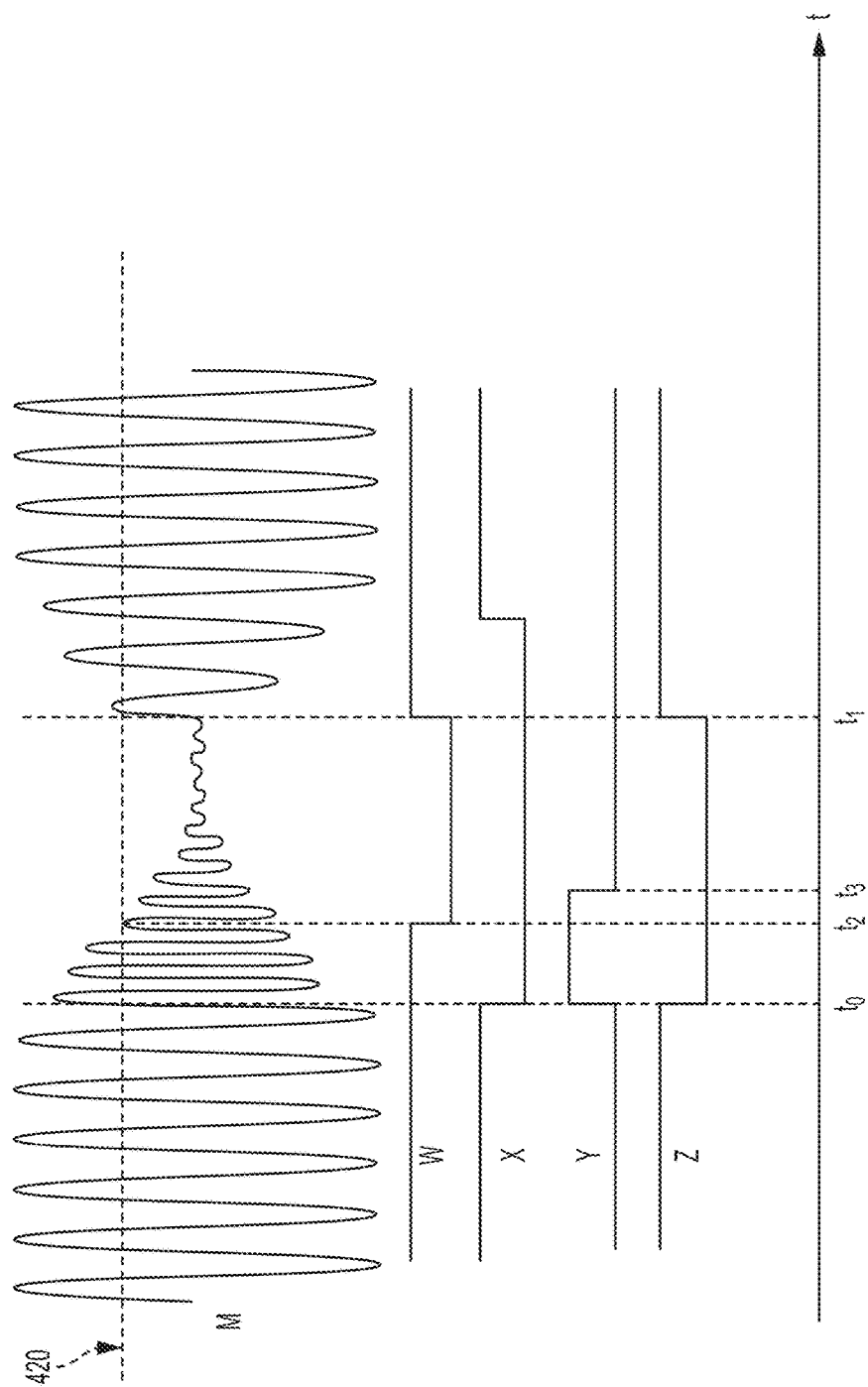
FIG. 4B is a plot illustrating an amplitude-modulated signal, a plurality of intermediate signals, and an output signal obtained using the demodulator of FIG. 3, according to some non-limiting embodiments.
Figure 5:
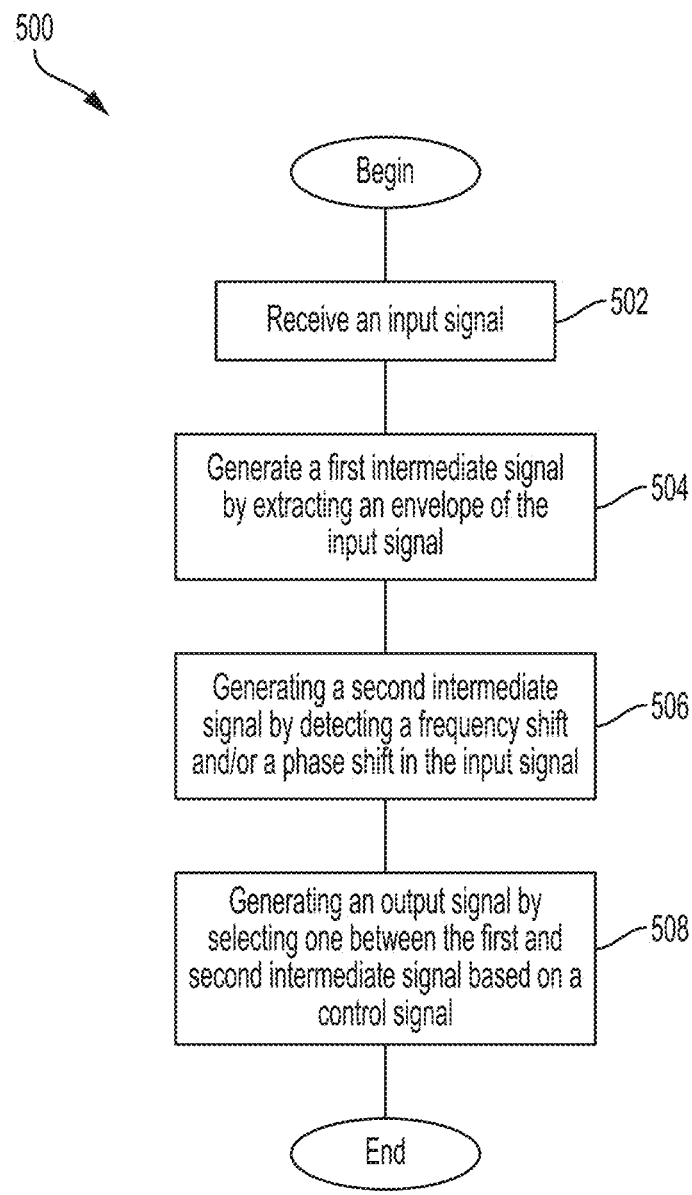
FIG. 5 is a flowchart illustrating a method for demodulating amplitude-modulated signals, according to some non-limiting embodiments.

FIG. 4B illustrates an example of how demodulator 300 may respond to an amplitude-modulated signal, and FIG. 5 is a flowchart illustrating a method for demodulating an amplitude-modulated signal. In particular, FIG. 4B illustrates a received signal M (received via matching network 204), first intermediate signal W (output by amplitude detector 302), second intermediate signal X (output by phase/frequency detector 304), control signal Y (output by amplitude/phase detection selection window unit 316), and output signal Z (output by selector 308).

Method 500 begins at act 502, in which signal M is received through a matching network. In this example, signal M exhibits ringing between $t_0$ and $t_1$. The ringing oscillation may be damped, in some embodiments, such that—its amplitude decays between $t_0$ and $t_1$. The rate at which the ringing oscillation decays may depend on the Q of the matching network, such that the lower the Q, the larger the decay rate.

At act 504, first intermediate signal W is generated by extracting the envelope of signal M using amplitude detector 302. As illustrated in FIG. 4B, first intermediate signal W may switch to a low-level when the envelope of signal M is below threshold 420, which occurs at $t_2$. At time $t_1$, the envelope of signal M increases above the threshold, and as a result first intermediate signal W switches to a high-level.

At act 506, second intermediate signal X is generated by detecting, using phase/frequency detector 304, a phase and/or a frequency shift. As illustrated in FIG. 4B, second intermediate signal X may switch to a low-level at $t_0$ in response to detecting that a frequency and/or a phase shift has occurred. In some embodiments, intermediate signal X returns to a high-level after $t_1$ due to a delay introduced by phase/frequency detector 304.

At act 508, output signal Z may be generated by selecting one between first intermediate signal W and second intermediate signal X based on control signal Y. In the example of FIG. 4B, selector 308 is configured such that output signal Z is equal to intermediate signal W when control signal Y is a low-level and is equal to intermediate signal X when control Y is a high-level.

In this example, amplitude/phase detection selection window unit 316 may be configured such that control signal Y switches to a low-level (thereby causing selector 308 to select second intermediate signal X for the output) when a frequency and/or phase shift is detected by phase-frequency detector 304. For example, control signal Y of a preset pulse width (of the duration of the selector window) may be triggered by an edge in second intermediate signal X. In some embodiments, amplitude/phase detection selection window unit 316 may be configured to cause selection of second intermediate signal X for a predefined time interval that is less than the duration of a symbol (e.g., less than $t_1$-$t_0$). Accordingly, amplitude/phase detection selection window unit 316 may comprise circuitry, such as a counter or a delay unit, to cause control signal Y to switch to a low-level at the end of this time interval. In this example, control signal Y switches to a logic-0 at $t_3$. The duration of the phase detection selection window (that is, $t_3$-$t_0$) may be set in view of the Q of the matching network, to ensure that the envelope of signal M is below the threshold throughout the duration of the amplitude detection window. During the phase detection selection window, signal X determines the value of output signal Z. It should be appreciated that, in some embodiments, the selection window Y is triggered if a phase/frequency shift greater than a threshold is received. From $t_3$ onwards, signal W determines the output signal Z. In cases in which no frequency or phase shift takes place, the output signal Z may be determined solely by signal W. A value representing the duration of the phase detection selection window may be stored in a memory of amplitude/phase detection selection window unit 316. It should be appreciated that the method of FIG. 5 is only an example of a process that may be used in connection with the demodulation techniques described herein. Alternative demodulation methods may be used in other embodiments.

It should be appreciated, that opposite polarities relative to the ones shown in FIG. 4B may be used for signals W, X, Y and/or Z, as the application is not limited to any specific polarity.

It should be further appreciated that, in some embodiments, high-levels may represent logic is and low-levels may represent logic 0s. However, the opposite logic, or any other suitable logic, may be used.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A method for demodulating an amplitude-modulated input signal received with an antenna, the method comprising:
    receiving a detection signal generated with a matching network coupled to the antenna, based on the amplitude-modulated input signal; and
    generating a demodulated output signal,
        wherein generating the demodulated output signal comprises:
            detecting whether ringing in the detection signal occurs in a first time period; and
            when ringing in the detection signal is detected to occur in the first time period, setting the demodulated output signal to a first level during at least a portion of the first time period.

2. The method of claim 1, wherein generating the demodulated output signal further comprise extracting an envelope of the detection signal during a second time period different than the first time period.

3. The method of claim 2, wherein extracting the envelope of the detection signal comprises comparing the envelope of the detection signal to a threshold.

4. The method of claim 1, wherein detecting whether the ringing in the detection signal occurs comprises detecting a frequency shift or a phase shift in the detection signal.

5. The method of claim 1, wherein setting the demodulated output signal to the first level during the at least a portion of the first time period comprises setting the demodulated output signal to the first level for an interval having a duration that is derived from a duration of a symbol in the amplitude-modulated input signal.

6. The method of claim 1, wherein setting the demodulated output signal to the first level during the at least a portion of the first time period comprises setting the demodulated output signal to a low-level during the at least a portion of the first time period.

7. The method of claim 1, wherein the detection signal is generated at least in part by filtering the amplitude-modulated input signal with a bandpass filter.

8. The method of claim 7, wherein filtering the amplitude-modulated input signal with the bandpass filter comprises filtering the amplitude-modulated input signal with a filter having a center frequency that is offset relative to a carrier frequency of the amplitude-modulated input signal.

9. A demodulator for demodulating an amplitude-modulated input signal received with an antenna, the demodulator comprising:
    control circuitry configured to:
        receive a detection signal generated with a matching network coupled to the antenna based on the amplitude-modulated input signal; and
        generate a demodulated output signal,
            wherein the circuitry is configured to generate the demodulated output signal at least in part by:
                detecting whether ringing in the detection signal occurs in a first time period; and
                when ringing in the detection signal is detected to occur in the first time period, setting the demodulated output signal to a first level during at least a portion of the first time.

10. The demodulator of claim 9, wherein the control circuitry is further configured to generate the demodulated output signal at least in part by extracting an envelope of the detection signal during a second time period different than the first time period.

11. The demodulator of claim 10, wherein the control circuitry is configured to extracting the envelope of the detection signal at least in part by comparing the envelope of the detection signal to a threshold.

12. The demodulator of claim 9, wherein the control circuitry is configured to detect whether the ringing in the detection signal occurs at least in part by detecting a frequency shift or a phase shift in the detection signal.

13. The demodulator of claim 9, wherein the control circuitry is configured to set the demodulated output signal to the first level for an interval having a duration that is derived from a duration of a symbol in the amplitude-modulated input signal.

14. The demodulator of claim 9, wherein the first level comprises a low-level.

15. The demodulator of claim 9, wherein the demodulator further comprises a bandpass filter, and wherein the detection signal is generated at least in part by filtering the amplitude-modulated input signal with the bandpass filter.

16. The demodulator of claim 15, wherein filtering the amplitude-modulated input signal with the bandpass filter comprises filtering the amplitude-modulated input signal with a filter having a center frequency that is offset relative to a carrier frequency of the amplitude-modulated input signal.

17. A demodulator for demodulating an amplitude-modulated input signal received with an antenna, the demodulator comprising:
    an amplitude detector coupled to a matching network coupled to the antenna;
    a phase detector or a frequency detector coupled to the matching network; and
    a selector having a first input terminal coupled to the amplitude detector, a second input terminal coupled to the phase detector or the frequency detector, and a control terminal coupled to control circuitry.

18. The demodulator of claim 17, wherein the demodulator further comprises a time delay unit coupled to the phase or frequency detector.

19. The demodulator of claim 17, wherein the amplitude detector comprises a comparator coupled to the matching network.

20. The demodulator of claim 17, wherein the matching network has a resonant frequency that is offset relative to a carrier frequency of the amplitude-modulated input signal.

* * * * *